United States Patent [19]
Kobayashi et al.

[11] Patent Number: 5,006,478
[45] Date of Patent: Apr. 9, 1991

[54] METHOD FOR MANUFACTURE OF SEMICONDUCTOR DEVICE

[75] Inventors: Junichiro Kobayashi; Shigeru Hiramatsu; Hidemi Takakuwa, all of Kanagawa, Japan

[73] Assignee: Sony Corporation, Tokyo, Japan

[21] Appl. No.: 556,480

[22] Filed: Jul. 24, 1990

[30] Foreign Application Priority Data

Jul. 25, 1989 [JP] Japan .................. 64-192854

[51] Int. Cl.$^5$ .......................... H01L 21/265
[52] U.S. Cl. ......................... 437/41; 437/80; 437/912; 437/944; 148/DIG. 100; 148/DIG. 143
[58] Field of Search ............ 437/912, 80, 944, 41; 148/DIG. 100, DIG. 143

[56] References Cited

U.S. PATENT DOCUMENTS

| | | | |
|---|---|---|---|
| 3,994,758 | 11/1976 | Ogawa et al. | 437/912 |
| 4,283,483 | 8/1981 | Coane | 437/80 |
| 4,440,804 | 4/1984 | Milgram | 437/944 |
| 4,489,101 | 12/1984 | Shibata | 437/944 |
| 4,599,790 | 7/1986 | Kim et al. | 437/912 |
| 4,804,635 | 2/1989 | Young | 437/912 |
| 4,871,687 | 10/1989 | Donzelli | 437/944 |

FOREIGN PATENT DOCUMENTS

| | | | |
|---|---|---|---|
| 0133876 | 10/1981 | Japan | 437/912 |
| 0141222 | 8/1984 | Japan | 148/DIG. 100 |
| 0232423 | 12/1984 | Japan | 148/DIG. 100 |
| 0231331 | 11/1985 | Japan | 148/DIG. 100 |

*Primary Examiner*—Brian E. Hearn
*Assistant Examiner*—Kevin Picardat

[57] ABSTRACT

A method for manufacturing a semiconductor device, comprising the steps of forming a first resist layer, an intermediate layer and a second resist layer sequentially on a substrate; forming an aperture by removing a portion of the second resist layer where a T-shaped gate is to be later formed; over-etching a portion of the intermediate layer opposed to the aperture thereby forming in the intermediate layer an aperture larger than the first-mentioned aperture; and forming, in the first resist layer, an aperture which is smaller than the aperture in the second resist layer which is positioned inside thereof. Due to the combination of such successive steps, the lift-off process required to form a desires T-shaped gate can be substantially improved.

10 Claims, 9 Drawing Sheets

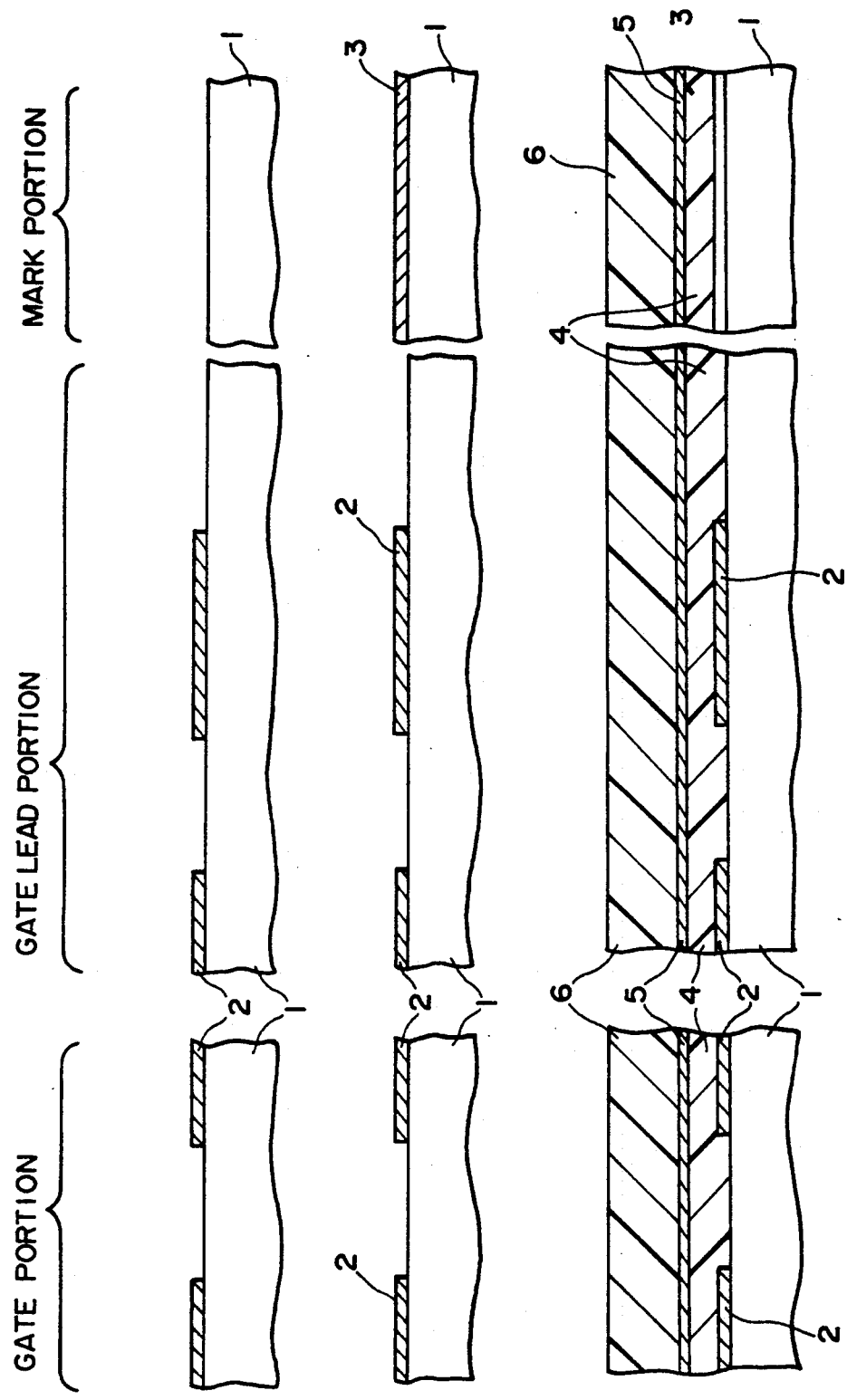

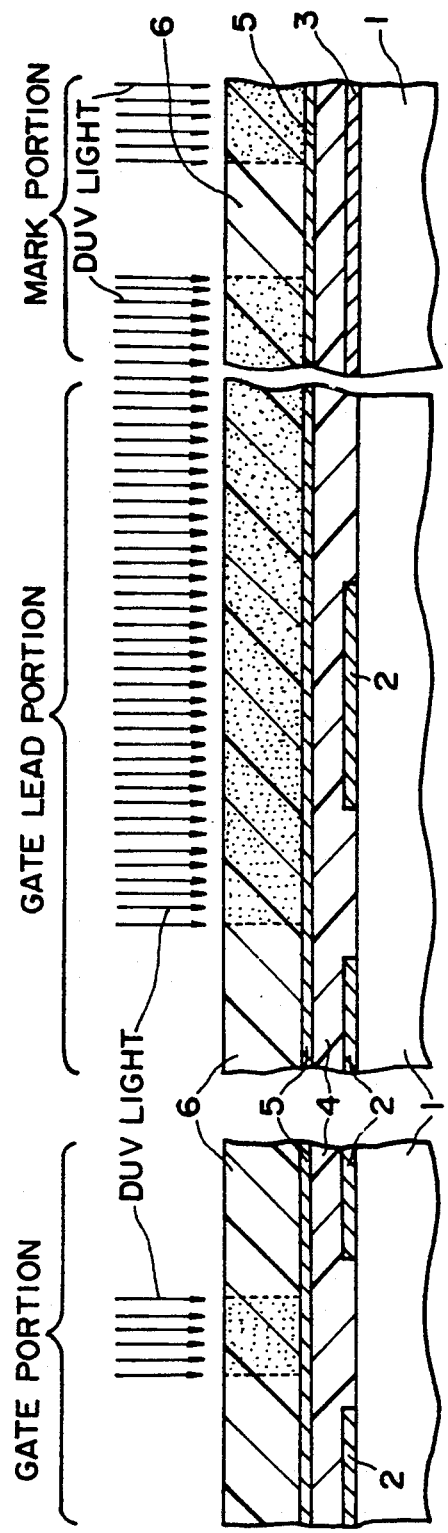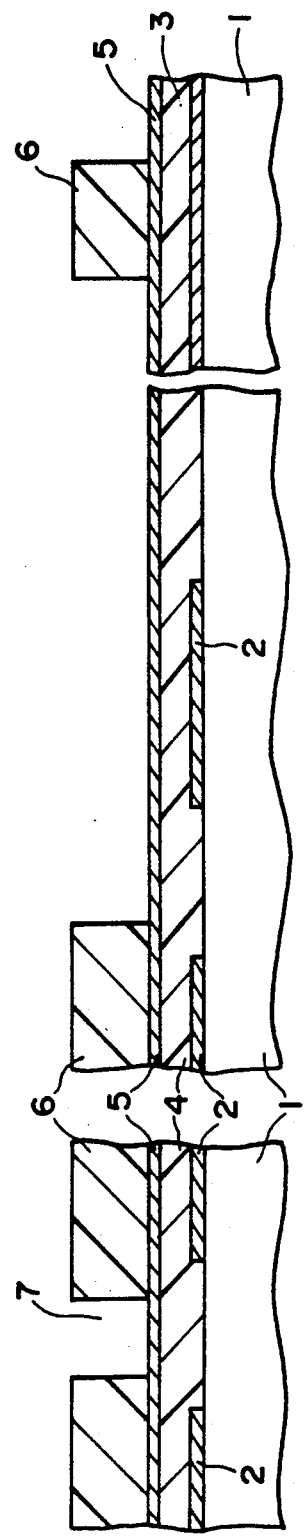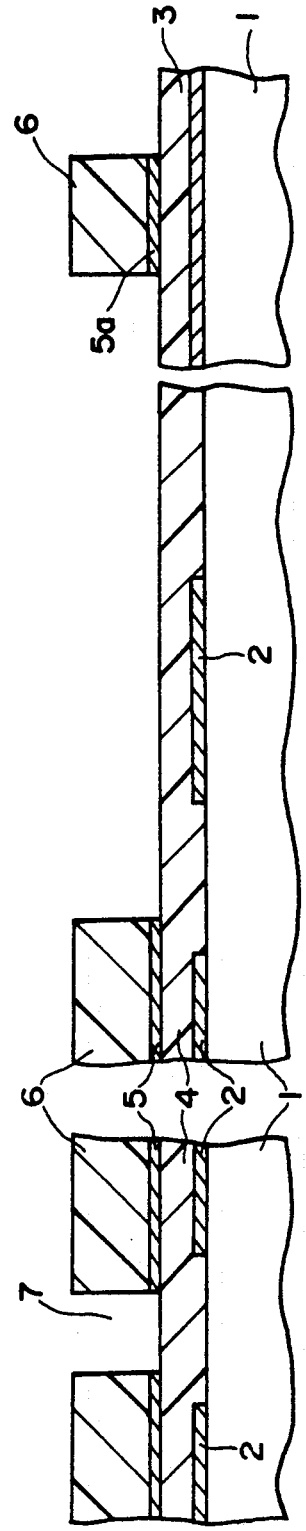

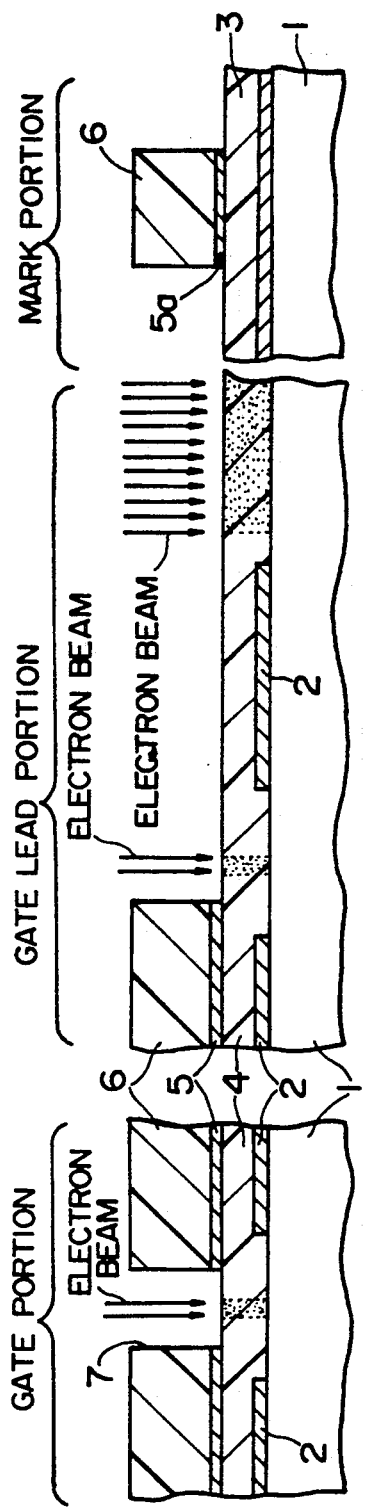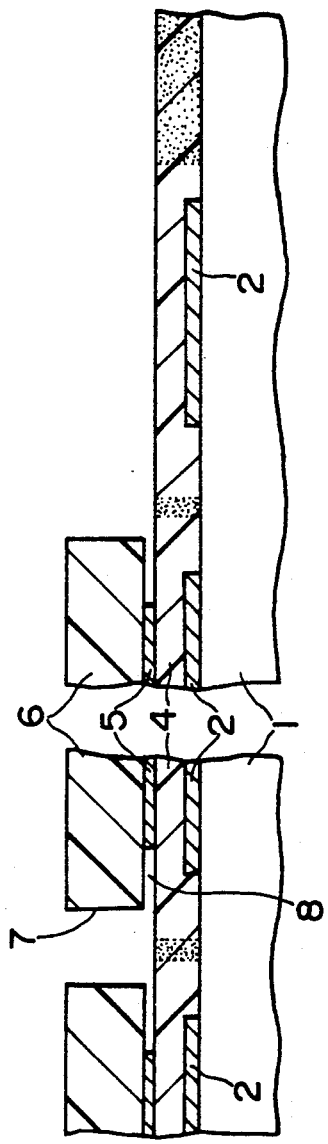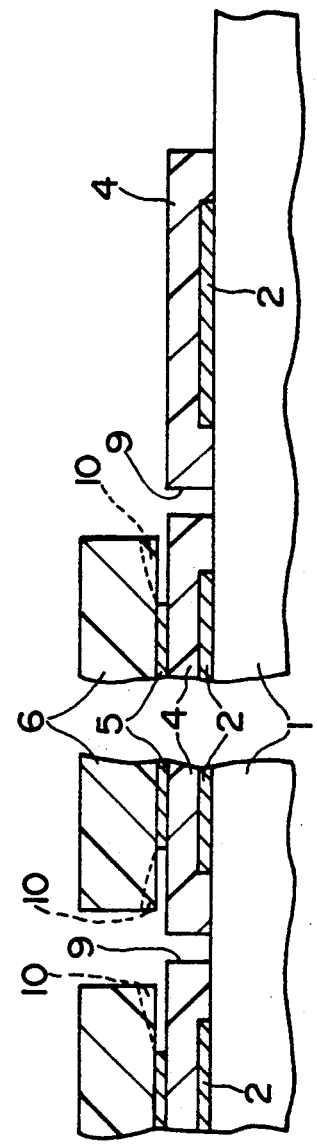
FIG. 1G
FIG. 1H
FIG. 1I

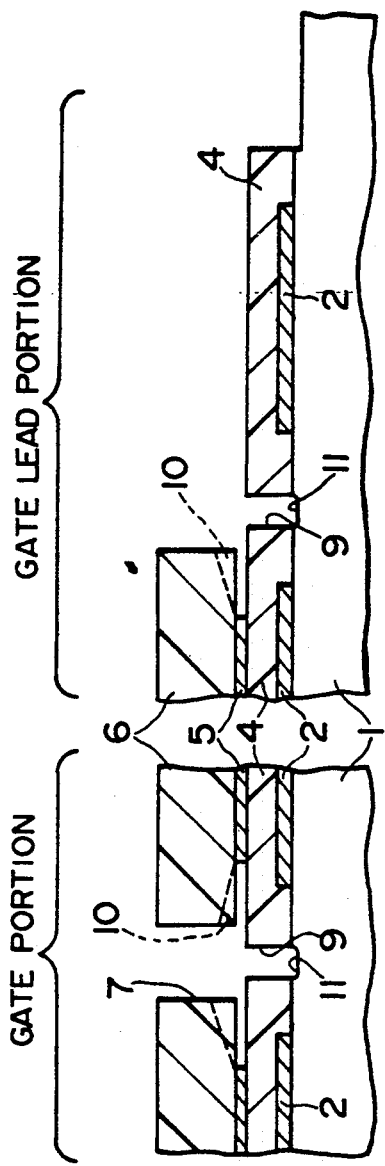
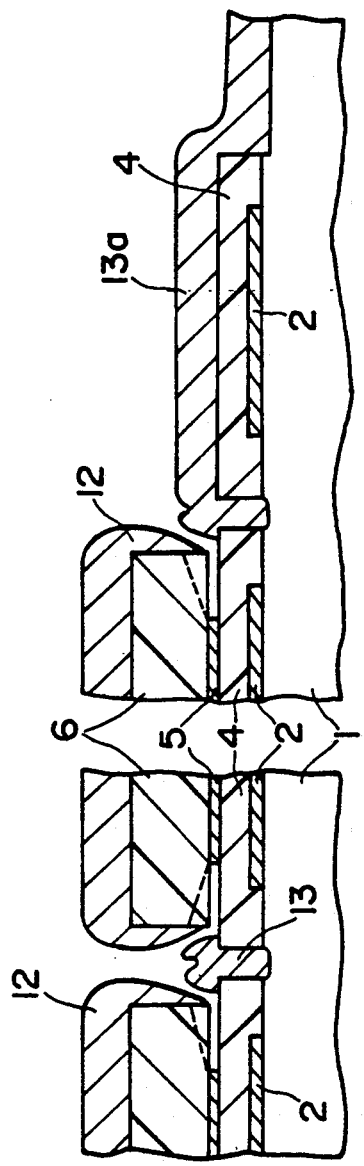
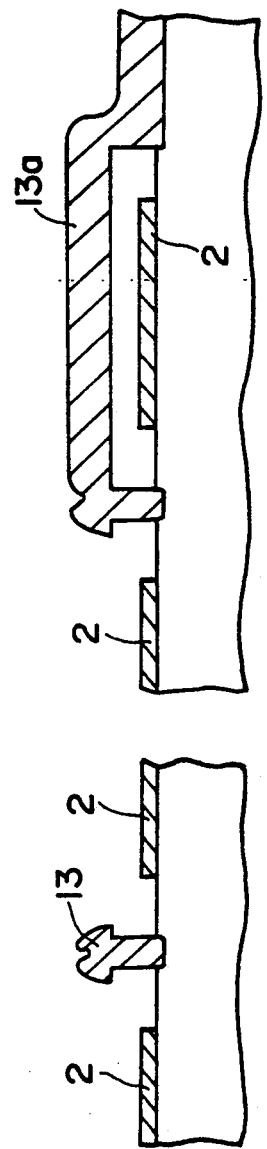
FIG. 1J
FIG. 1K
FIG. 1L

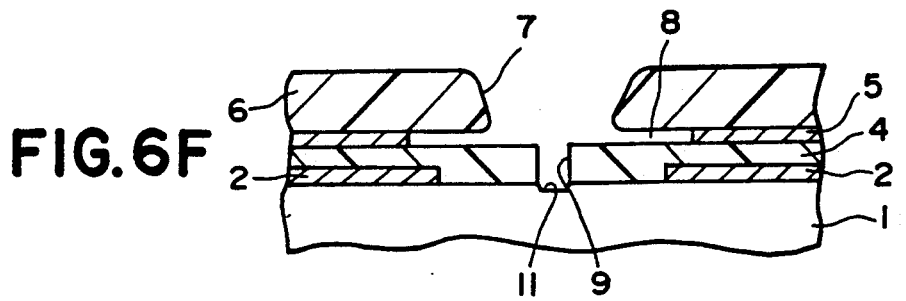
FIG.6F
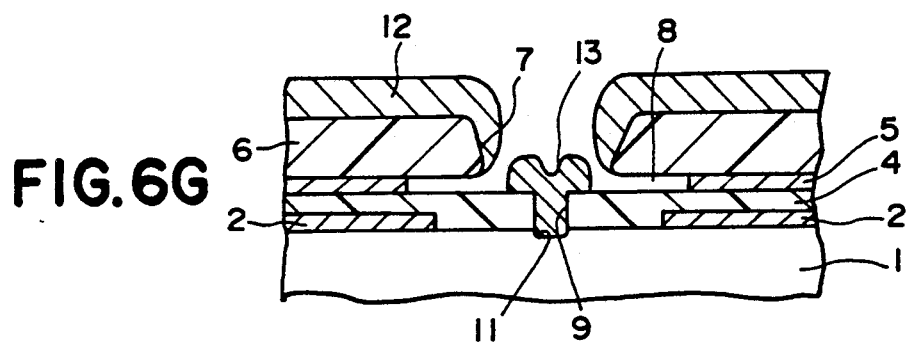
FIG.6G
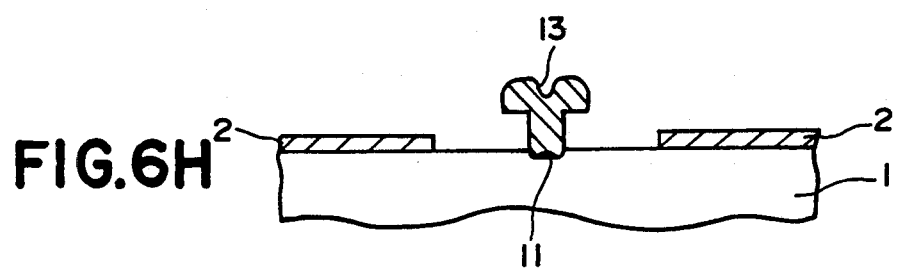
FIG.6H
FIG. 7
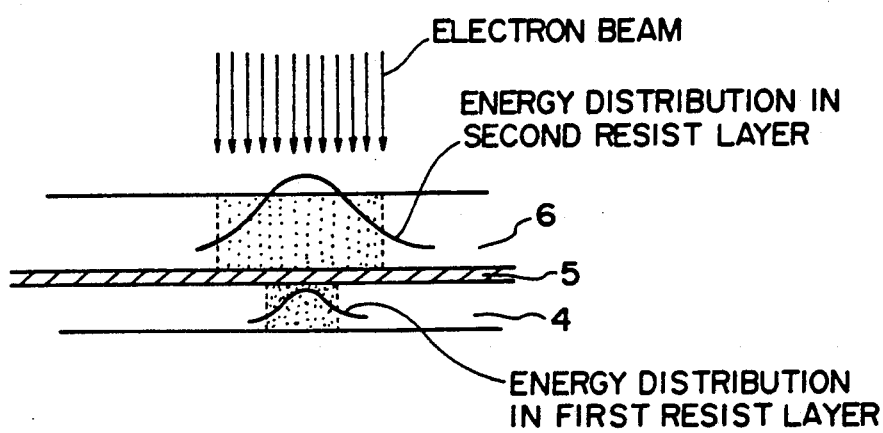

METHOD FOR MANUFACTURE OF SEMICONDUCTOR DEVICE

BACKGROUND OF THE INVENTION

1. Field of the Invention

The present invention relates to a method for manufacture of a semiconductor device and, more particularly, a semiconductor device wherein a T-shaped gate (mushroom-like gate) is formed on a substrate of a compound semiconductor or the like.

2. Description of Related Art

In any very high speed transistor known as HEMT or the like, it is necessary that the gate be formed so as to be sectionally T-shaped (mushroom-like) for reducing the gate resistance while shortening the length.

FIGS. 8A through 8F are sectional views illustrating successive steps executed sequentially in a first conventional example of a method for forming such a T-shaped gate.

[A] As shown in FIG. 8A, a first resist layer b and a second resist layer c are sequentially formed on a substrate a which is composed of a compound semiconductor.

[B] Then, as shown in FIG. 8B, the second resist layer c is processed by exposure to an electron beam of a relatively low energy. The reason for employing such a low-energy electron beam is so as to protect the first resist layer from exposure to the electron beam. An exposed portion d of the second resist layer c is shown.

[C] Subsequently, as shown in FIG. 8C, the first resist layer b is exposed by the use of a relatively high energy. An exposed portion e of the first resist layer b is illustrated. The area of the exposed portion e is considerably smaller than that of the exposed portion d of the second resist layer c.

[D] Thereafter, as shown in FIG. 8D, the second resist layer c and the first resist layer b are patterned by a developing process.

[E] Next, as shown in FIG. 8E, a film is formed by evaporating a suitable gate material such as aluminum, whereby a T-shaped gate g is formed in the aperture of the first resist layer b.

[F] Finally, as shown in FIG. 8F, the first resist layer b and the second resist layer c are removed together with the aluminum film f on the second resist layer c.

The steps of forming the T-shaped gate g are thus completed by the above procedure.

FIG. 9 is a sectional view of a second conventional example achieved by partially modifying the T-shaped gate forming method illustrated in FIG. 8.

According to this example of the T-shaped gate forming method a first resist layer b and a second resist layer c are sequentially formed on a substrate a, and the material of the first resist layer is selected so as to be lower in sensitivity than that of the second resist layer. As illustrated in FIG. 9, the two resist layers b and c are exposed in a single process. An aperture is formed in the lower or first resist layer which is smaller than an aperture in the upper or second resist layer c. According to this conventional method, a single exposure step is sufficient to attain this purpose since the respective sensitivities of the first resist layer b and the second resist layer c are different from each other.

FIGS. 10A through 10E are sectional views illustrating successive steps sequentially in a third conventional example for forming the T-shaped gate.

[A] After a first resist layer b is formed on a substrate a, the first resist layer b is exposed to an electron beam and then is developed to form an aperture h therein.

[B] Subsequently, a film is formed by evaporation of a suitable gate material (e.g., aluminum), and the first resist layer b is lifted off to consequently form a gate f as shown in FIG. 10B. In this stage, however, the gate has no portion which corresponds to the head of a mushroom.

[C] Then, as shown in FIG. 10C, a SiN film i and a second resist layer c are sequentially formed on the substrate a.

[D] Next, the second resist layer c is exposed by the use of an electron beam and then is developed to form an aperture j in a portion around the gate f, as shown in FIG. 10D. This aperture is greater than the aforementioned aperture h.

[E] Subsequently, as shown in FIG. 10E, a gate material film is formed by evaporation so as to form the head of the T-shaped gate.

Thereafter the layers are lifted off as in the first conventional example of FIG. 8, whereby merely the T-shaped gate alone is left on the substrate a.

In the conventional T-shaped gate forming methods illustrated in FIGS. 8 and 9, there are some disadvantages such as variations of size result of the post-development aperture due to variations in the thickness and the sensitivity of the first resist layer b and the second resist layer c, and satisfactory reproducibility cannot be attained with respect to the dimensions and the sectional contour of the T-shaped gate. Also, there exists a problem of insufficient lift-off facility.

For another conventional T-shaped gate forming method such as illustrated in FIG. 10, it is necessary to execute the exposure step twice by the use of an electron beam which requires a considerable time for tracing the path, hence resulting in a disadvantage of low throughput. Also, the problem of deficient lift-off facility still remains.

As described above, in the entire conventional examples of the T-shaped gate forming methods illustrated in FIGS. 8 through 10, there are common disadvantages of insufficient lift-off facility and low yield rate and difficulty to form a satisfactory T-shaped gate.

OBJECTS AND SUMMARY OF THE INVENTION

The present invention has been accomplished in view of the problems mentioned. Its object is to provide an improved method which is capable of easing the lift-off process required in forming a desired T-shaped gate and to thereby enhance the lift-off facility.

In the method of the present invention, there are executed, for facilitating such lift-off process, successive steps of sequentially forming a first resist layer, an intermediate layer and a second resist layer on a substrate, an intermediate layer and a second resist layer on a substrate, then patterning the second resist layer to form an aperture, subsequently over-etching the intermediate layer to form an aperture larger than the first-mentioned aperture in the second resist layer, and thereafter forming, in the first resist layer, another aperture which is smaller than the aperture in the second resist layer.

Thus, according to the semiconductor device manufacturing method of the present invention, an intermediate layer is interposed between the first and the second resist layers, and after the second resist layer is patterned to form an aperture therein, the intermediate layer is overetched through such aperture so that the first resist layer is under-cut, and subsequently the first resist layer is patterned, whereby the lift-off facility can be remarkably enhanced.

Other objects and features of the present invention will become apparent from the following description which will be given with reference to the illustrative accompanying drawings.

BRIEF DESCRIPTION OF THE DRAWINGS

FIGS. 1 through 5 represent a first embodiment of the method of the present invention for the manufacture of a semiconductor device, in which FIGS. 1A through 1L are sectional views illustrating successive steps of the method which are sequentially executed. FIG. 2 is a plan view of a semiconductor device; FIG. 3 is a sectional view taken along the line C—C in FIG. 2; FIG. 4 is a plan view which shows one background art relative to a gate leading means; and FIG. 5 is a sectional view showing another background art relative to a gate leading means;

FIGS. 6A through 6H are sectional views illustrating successive steps of the semiconductor device manufacturing method of the present invention which are sequentially executed.

FIG. 7 is an explanatory diagram depicting the filter effect of an intermediate layer;

DESCRIPTION OF THE PREFERRED EMBODIMENTS

Figure 2:
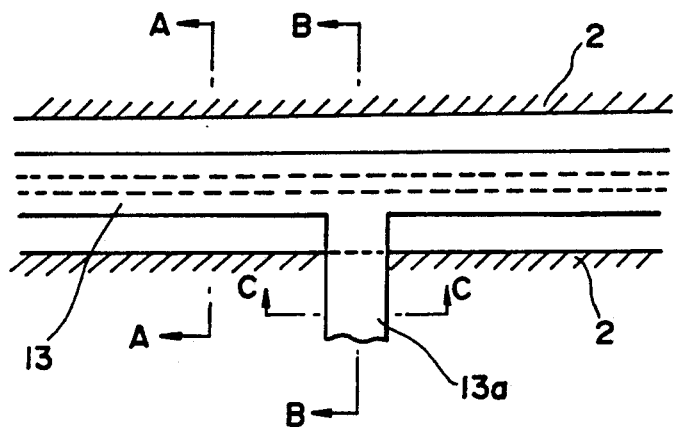

Hereinafter the semiconductor device manufacturing method of the present invention will be described in detail with reference to exemplary embodiments thereof shown in the accompanying drawings.

FIGS. 1A through 1L are sectional views illustrating successive steps of a first exemplary embodiment to implement the semiconductor device manufacturing method of the present invention.

[A] First, as shown in FIG. 1A, a source electrode and a drain electrode (AuGe/Ni) 2 are selectively formed on the surface of a compound semiconductor substrate (e.g., GaAs substrate) 1.

[B] Then, as shown in FIG. 1B, a reflecting film 3 of gold, chromium, titanium or the like is formed to a thickness less than 1000 angstroms in a portion where a mark is to be formed later. The requisite for the reflecting film 3 is merely to satisfy the condition that it can serve as a foundation for a positioning mark in an intermediate layer of aluminum or the like to be formed later above the reflecting film 3, and strict conditions are not required with regard to the pattern and the positional precision. The reflecting film 3 is provided for the purpose of attaining a sufficiently high intensity ratio between the reflected electrons (secondary electrons) in the mark and those in any other portion when a positioning step is later executed by detecting the position of the mark by the use of an electron beam. Therefore, in case a required high intensity ratio of the reflected electrons can be obtained without provision of the reflecting film 3, it is not absolutely necessary to form such film 3.

[C] Subsequently, as shown in FIG. 1C, a first resist layer 4, an intermediate layer 5 and a second resist layer 6 are sequentially formed on the substrate 1.

The first resist layer 4 is of positive type (e.g., such as OEBR-1010 (trade name) made by Tokyo Applied Chemical Co., Ltd.) which is to be exposed by the use of an electron beam and has a thickness of 0.4 micron or so.

The intermediate layer 5 is composed of aluminum, for example, and has a thickness of 1000 angstroms or so. As will be described in detail later, the intermediate layer 5 serves essentially to improve the lift-off facility and has, particularly in this embodiment, an additional role to shield the first resist layer 4 from exposure by intercepting the light at the time of exposure of the second resist layer 6. Furthermore, the intermediate layer 5 functions also as a positioning reference mark at the time of exposing the first resist layer 4 after patterning the second resist layer 6.

The second resist layer 6 is of positive type (e.g., such as ODUR-1010 (trade name) made by Tokyo Applied Chemical Co., Ltd.) which is to be exposed by the use of DUV light and has a thickness of 1.2 micron or so.

[D] Subsequently, as shown in FIG. 1D, the second resist layer 6 is exposed to DUV light. Such exposure is selectively applied to a T-shaped gate forming region inclusive of a gate lead portion, but not to a mark portion in a mark forming region.

During the step of such exposure, the intermediate layer 5 serves as a shielding film to the DUV light, thereby positively preventing exposure of the first resist layer 4.

[E] Next, as shown in FIG. 1E, the second resist layer 6 is developed to form an aperture 7 in the region where a T-shaped gate is to be formed. At the said time in the mark forming region, the second resist layer 6 is partially left in the portion which is to be used as a mark.

[F] Thereafter, as shown in FIG. 1F, the intermediate layer 5 is selectively removed by etching with a solution while masked with the second resist layer 6. In the mark forming region, a portion 5a of the intermediate layer 5 which is left unremoved due to the mask of the second resist layer 6 becomes a positioning mark.

[G] Subsequently, as shown in FIG. 1G, the first resist layer 4 is exposed by an electron beam. Such exposure is performed for opening a portion where the T-shaped gate is to be in contact with the substrate 1, and the exposed portion needs to be positioned inside of the aperture 7 and to be narrower than the aperture 7. It is necessary that high positional precision be attained between the exposed position and the aperture 7, and therefore the positioning is carried out with reference to the positioning mark 5a formed in the intermediate layer. Consequently, it becomes possible to ensure the required high positioning precision.

Upon completion of the positioning stage during the exposure, the positioning mark 6 is not later used.

During the step of exposure with the electron beam, the intermediate layer 5 serves to suppress charge-up of the exposed portion. A description will be given below relative to this function. During the step of exposure by the electron beam, the exposed portion of the resist layer is charged up, and a repulsive force is exerted on a new electron beam which is successively irradiated. Since such repulsive force is exerted so as to deviate the electron beam from its target point, there are induced some faults such as enlarging the exposed region and deteriorating the positional precision during the exposure.

However, according to the semiconductor device manufacturing method of the present invention, the charges in the exposed portion are ready to be dissipated by way of the intermediate layer 5 which is conductive and which is located in the vicinity of the exposed region. As a result, the intermediate layer 5 can serve effectively to suppress charge up.

[H] Next, as shown in FIG. 1H, the intermediate layer 5 is over-etched through the aperture 7. This etching step is executed so as to produce a gap 8 (under-etched portion for the second resist layer 6) between the first resist layer 4 and the second resist layer 6. The amount of side etching is 1 micron or so. Due to the existence of such gap 8, the lift-off process to be carried out later is facilitated.

[I] Then, as shown in FIG. 1I, the first resist layer 4 is developed. An aperture 9 is formed during such developing step, and a lower portion of the T-shaped gate is to be later inserted therein.

During the developing step, the lower surface of the second resist layer 6 may be eroded as indicated by a broken line. Such eroded portion 10 serves to enhance the lift-off facility.

[J] Thereafter, as shown in FIG. 1J, the surface of the substrate 1 is recess-etched with the first resist layer 4 used as a mask, so that the pinch-off voltage of the transistor is lowered. The recess-etched portion 11 is shown in FIG. 1J.

[K] Next, as shown in FIG. 1K, a film 12 having a thickness of 5000 angstroms or so is formed by evaporating a suitable gate material such as aluminum. This step may be executed by oblique evaporation of the source-side offset or by evaporation without any offset.

Due to such evaporation, a T-shaped gate 13 is formed in the aperture of the first resist layer 4. Reference numeral 13a denotes a lead portion of the T-shaped gate 13. As will be later described in detail, the lead portion 13a of the T-shaped gate 13 is formed so as to be astride a source electrode or a drain region like an air bridge.

[L] Subsequently, the first resist layer 4 and the second resist layer 6 are lifted off together with the intermediate layer 5. Then, as shown in FIG. 1L, there is achieved a T-shaped gate.

Such lift-off operation can be extremely smoothly performed since the over-etched intermediate layer 5 exists between the first resist layer 4 and the second resist layer 6, and further the second resist layer 6 is in an under-etched state. Thus, the lift-off facility is enhanced. It thus becomes possible to properly form the T-shaped gate 13 with high reliability.

FIG. 2 is a plan view behind the T-shaped gate. The gate portion illustrated in FIGS. 1A through 1L corresponds to a view taken along the line A—A in FIG. 2, and the gate lead portion in FIG. 1 corresponds to a view taken along the line B—B in FIG. 2.

Figure 3:
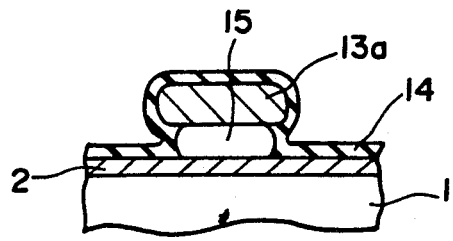

FIG. 3 is a sectional view taken along the line C—C in FIG. 2, wherein reference numeral 14 denotes a passivation film. Since film 14 is formed after completion of the T-shaped gate 13, it is not shown in FIG. 1.

A space 15 is enclosed by the T-shaped gate 13, the gate lead portion 13a, the electrode 2 and the passivation film 14. The space 15 is filled with air. In this structure, it becomes possible to reduce the parasitic capacitance between the gate and the substrate, since air has a minimum dielectric constant.

In this embodiment, the gate is led out using an air bridge mode. According to this technique, the first and second resist layers are formed with the intermediate layer interposed therebetween, and the first resist layer can be utilized as a space between the gate lead portion 13a and the substrate 1. Thus, the gate can be led out without the necessity of any additional step for forming a lead portion alone.

Figure 4:
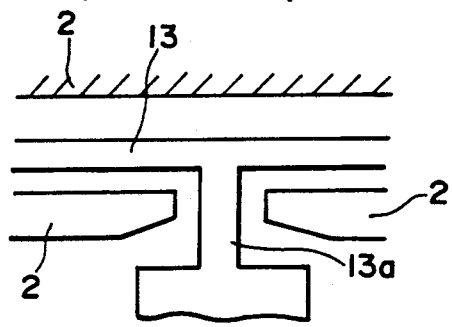
Figure 5:
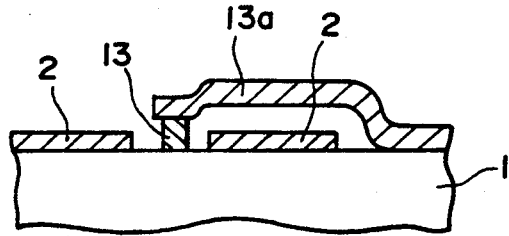

The method of leading out the gate in this embodiment will be compared with the known gate leading out means shown in FIGS. 4 and 5.

FIG. 4 is a plan view illustrating the simplest leading means, wherein either a source electrode 2 or a drain electrode 2 is divided, and a lead portion 13a of a T-shaped gate 13 is inserted into a space between the divided electrode portions.

In this structure, however, the existence of such divided portions causes a corresponding decrease of the drain current variation (gm) induced in relation to the gate voltage variation, and there arises another problem that the parasitic capacitance between the gate and the channel is increased.

FIG. 5 is a plan view of a semiconductor device constructed to solve the above problem. In this device, a lead portion 13a of a T-shaped gate 13 is formed like an air bridge.

That is, the lead portion 13a of the T-shaped gate 13 is formed so as to pass over, for example, a source electrode 2. In the known structure, however, the T-shaped gate 13 and its lead portion 13a are individually formed during different steps, which increases the number of required steps. Practically, according to the conventional means, the lead portion 13a is formed after completion of the T-shaped gate 13. In addition, some additional problems arise with regard to the positioning difficulty and the increase of the gate resistance due to the existence of contact resistance between the T-shaped gate 13 and the lead portion 13a.

However, according to the semiconductor device manufacturing method of the present invention illustrated in FIG. 1, none of these problems occur since the gate lead portion 13a is formed simultaneously with the T-shaped gate 13 while the first resist layer 4 is used as a temporary spacer.

In the above embodiment, the positioning mark 5a is formed from the intermediate layer 5, and such mark 5a is used as a positioning reference during the step of exposing the first resist layer 4. But it is to be understood that the procedure is not only limited thereto. In case a different positioning means is employed without forming such mark 5a, the step of exposing the second resist layer 4 and the step of over-etching the intermediate layer 5 may be reversed in order. That is, instead of over-etching the intermediate layer 5 after termination of the exposure, the first resist layer 4 may be exposed after completion of over-etching the intermediate layer 5.

FIGS. 6A through 6H are sectional views illustrating successive steps of a second exemplary embodiment to implement the semiconductor device manufacturing method of the present invention.

Figure 6A:
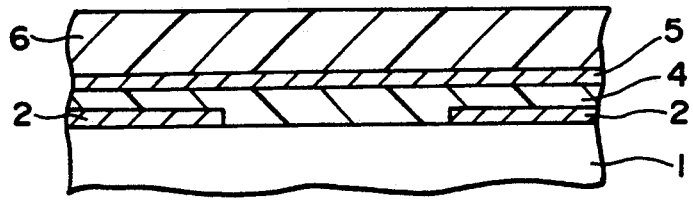

[A] As shown in FIG. 6A, a first resist layer 4, an intermediate layer 5 and a second resist layer 6 are sequentially formed after the completion of forming a source electrode and a drain electrode 2 on a substrate 1. The first resist layer 4 is of positive type such as (e.g., OEBR-1010 (trade name) made by Tokyo Applied Chemical Co., Ltd.) which is to be exposed by the use of an electron beam and has a thickness of 0.3 micron or so. The intermediate layer 5 is composed of aluminum, for example, and has a thickness of 1000 angstroms or so. The second resist layer 6 is of positive type such as (e.g., OEBR-1010 (trade name) made by Tokyo Applied Chemical Co., Ltd.) which is to be exposed by the use of an electron beam similarly to the first resist layer 4, and it has a thickness of 0.6 micron or so.

The first and second resist layers may have the same characteristics in this embodiment, or may have different ones as well. However, it is not preferable that the sensitivity of the second resist layer be lower than that of the first resist layer, because an aperture formed in the first resist layer needs to be definitely smaller than an aperture formed in the second resist layer.

Figure 6B:
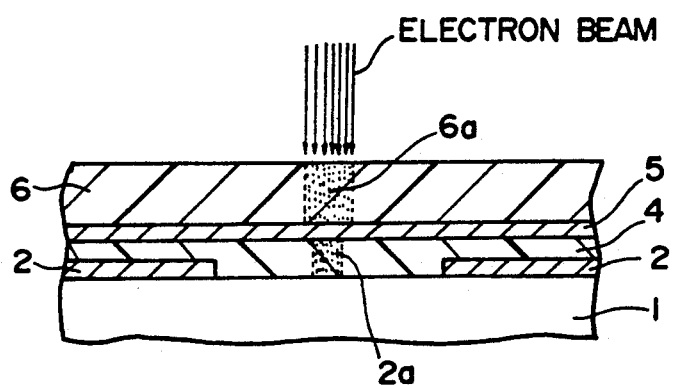

[B] Then, as shown in FIG. 6B, a region for forming a T-shaped gate is exposed by an electron beam.

Differing from the first embodiment, such exposure is executed not merely only on the second resist layer 6 but also on the first resist layer 4. Therefore, it is not necessary to execute the positioning, unlike the first embodiment, with reference to a mark 5a during the step of exposing the first resist layer after patterning the second resist layer. Consequently, the mark 5a need not be formed either so as to eventually eliminate the requirement of forming the reflecting film 3 in the first embodiment.

Since the thickness of the intermediate layer 5 is merely 0.1 micron or so, the light shielding effect thereof is not retained, so that the first resist layer 4 is also exposed by the electron beam through the intermediate layer 5 in addition to the second resist layer 6. In the first embodiment, DUV light is employed for exposure of the second resist layer 6 as mentioned, and the intermediate layer 5 serves as a light shielding film thereto. However, in the second embodiment, the electron beam for exposure is permitted to pass through the intermediate layer 5, thereby exposing the first resist layer 4 simultaneously with the second resist layer 6.

An aperture to be formed in the first resist layer 4 needs to be smaller than an aperture in the second resist layer 6. Since the intermediate layer 5 has a filter effect as illustrated in FIG. 7, the area of the exposed portion of the first resist layer 4 is reduced so as to be less than the area of the exposed portion of the second resist layer 6, which results in the desired dimensional relationship between the first resist layer 4 and the second resist layer 6. That is, in the first resist layer 4 where the energy of the irradiated electron beam is distributed through the intermediate layer 5, the energy distribution is made narrower than that in the second resist layer 6. Therefore, it becomes possible to reduce the exposed portion area of the first resist layer 4 so that it is smaller than that of the second resist layer 6.

Figure 6C:
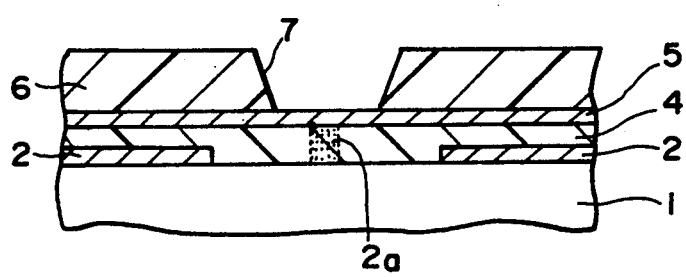

[C] Subsequently, as shown in FIG. 6C, the second resist layer 6 is developed to form an aperture 7. During this step, the size of the aperture 7 can be adjusted according to the development time and so forth. During development, the intermediate layer 5 functions as a mask to completely prevent erosion of the first resist layer 4.

Figure 6D:
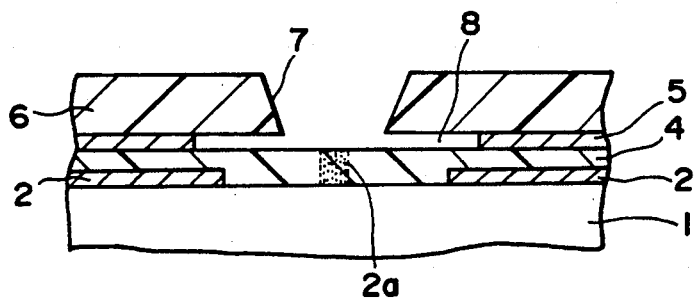

[D] Next, as shown in FIG. 6D, the intermediate layer 5 is over-etched to define a gap 8 between the first resist layer 4 and the second resist layer 6. Similarly as in the aforementioned first embodiment, such gap 8 is effective to enhance the lift-off facility.

Figure 6E:
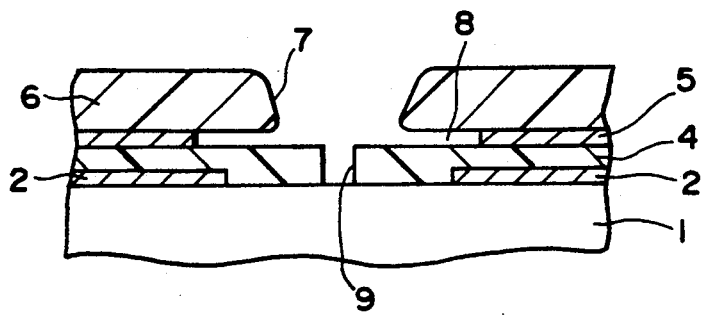
Figure 8A:
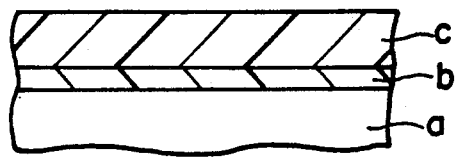
FIGS. 8A through 8F are sectional views illustrating successive steps of a first conventional example which are sequentially executed.
Figure 8B:
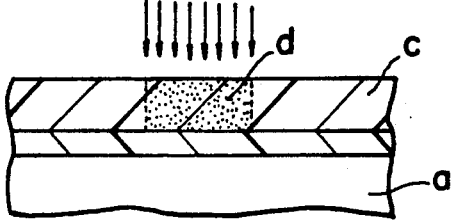
Figure 8C:
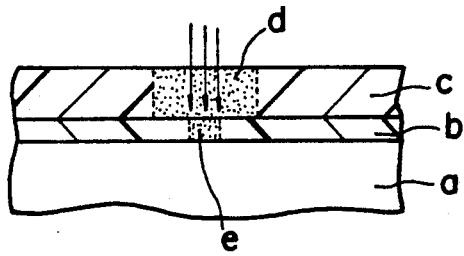
Figure 8D:
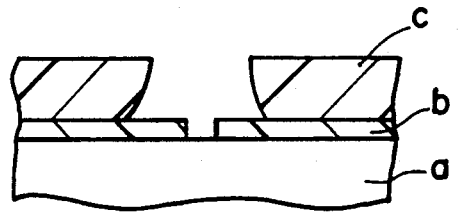
Figure 8E:
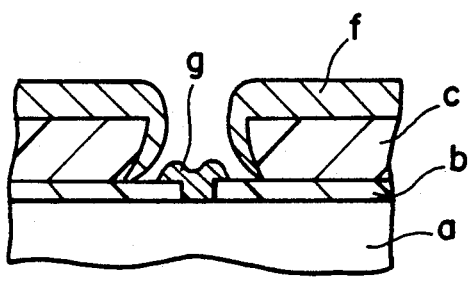
Figure 8F:
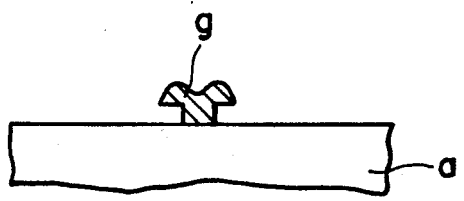
Figure 9:
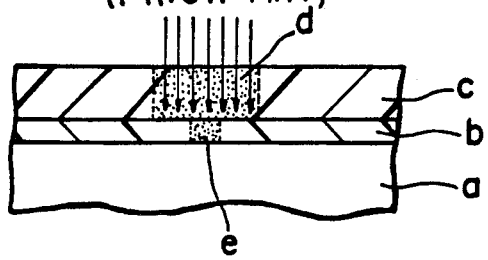
FIG. 9 is a sectional view representing a second conventional example.
Figure 10A:
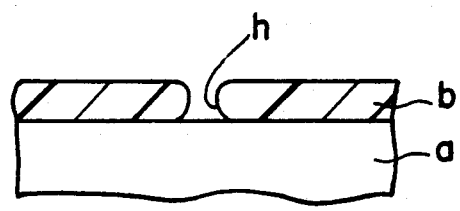
FIGS. 10A through 10E are sectional views illustrating successive steps of a third conventional example which are sequentially executed.
Figure 10B:
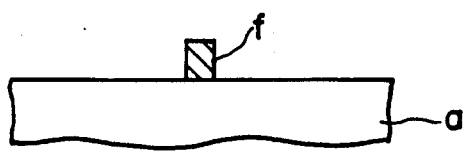
Figure 10C:
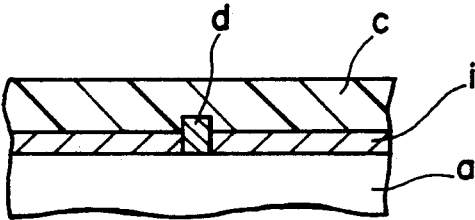
Figure 10D:
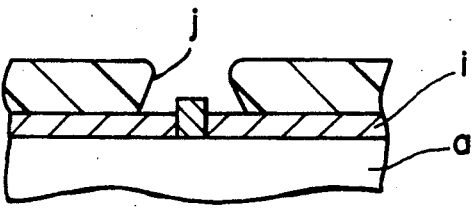
Figure 10E:
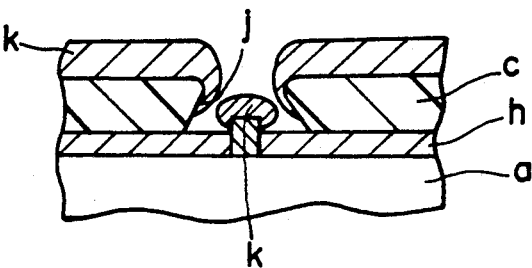

[E] Thereafter, as shown in FIG. 6E, the first resist layer 4 is developed to form an aperture 9. During this step, the second resist layer 6 is somewhat eroded so that the aperture 7 therein is made slightly larger than the aperture 9, whereby the lift-off facility is further enhanced.

[F] Subsequently, as shown in FIG. 6F, the surface of the substrate 1 is recess-etched while the first resist layer 4 is used as a mask. A recess-etched portion 11 is illustrated.

[G] Next, as shown in FIG. 6G, a film 12 is formed by evaporating a suitable gate material (such as aluminum), so that a T-shaped gate 13 is formed in the aperture 9 of the first resist layer 4.

[H] Thereafter, the layers are lifted off to attain a condition where the T-shaped gate 13 is formed on the substrate 1, as shown in FIG. 6H.

The lift-off facility is enhanced due to the under-cut portion 8 produced for the second resist layer 6 by over-etching the intermediate layer 5 and also due to the rounded or narrowed contour of the second resist layer 6 caused by the development of the first resist layer 4. Consequently, the lift-off operation can be smoothly performed.

In this second embodiment also, the intermediate layer 5 is effective to suppress the charge-up during the step of exposure.

Although the intermediate layer 5 in this embodiment is composed of aluminum, the material is not limited to such material, and it need not be metallic.

Furthermore, it may be composed of an insulator film as well. Thus, any material is usable which can meet the requirements for the intermediate layer. Such condition is also applicable to the first embodiment. However, in case the intermediate layer 5 is composed of an insulator material, the effect of preventing the charge-up is not obtained.

According to this semiconductor device manufacturing method, the step of exposure for forming a T-shaped gate can be completed with a single tracing movement of an electron beam, and it is not necessary to repeat the exposure as required in the first embodiment. In addition, the positioning between such repeated exposures is no longer necessary which increases the output.

The size of the aperture 7 in the second resist layer 6 can be controlled by adjusting the time for developing the second resist layer 6, and the first resist layer 4 can be completely masked with the intermediate layer 5 during such development. As a result, the size of the aperture 9 in the first resist layer 4 and that of the aperture 7 in the second resist layer 6 are independently controllable of each other.

As described hereinabove, the features of the semiconductor device manufacturing method of the present invention comprise executing successive steps of sequentially forming a first resist layer, an intermediate layer and a second resist layer on a substrate, then forming an aperture by removing a portion of the second resist layer where a T-shaped gate is to be later formed. Then subsequently over-etching the intermediate layer portion opposed to such aperture, thereby forming in the intermediate layer an aperture larger than the first-mentioned aperture, and thereafter forming in the first resist layer another aperture which is smaller than the aperture in the second resist layer and which is positioned inside thereof.

Thus, according to the semiconductor device manufacturing method of the present invention, the intermediate layer is interposed between the first and second resist layers and, after the second resist layer is patterned, the intermediate layer is over-etched through the aperture formed by such patterning, so that the second resist layer is under-cut. Thereafter the first resist layer is patterned to consequently attain substantial enhancement of the lift-off facility.

Although the invention has been described with respect to preferred embodiments, it is not to be so limited as changes and modifications can be made which are within the full intended scope of the invention as defined by the appended claims.

We claim as our invention:

1. A method for manufacturing a semiconductor device, comprising the steps of:
    sequentially forming a first resist layer, an intermediate layer and a second resist layer on a substrate;
    forming an aperture by removing a portion of said second resist layer where a T-shaped gate is to be later formed;
    over-etching a portion of said intermediate layer which is opposed to said aperture thereby forming in said intermediate layer an aperture larger than the first-mentioned aperture; and
    forming in said first resist layer an aperture which is smaller than the aperture in said second resist layer and which is positioned inside thereof.

2. In a method according to claim 1 forming a T-shaped gate in said apertures of said first and second resist layers, and lifting off from said substrate said first resist layer, said intermediate layer and said second resist layer so that said T-shaped gate remains on said substrate.

3. In a method according to claim 1 wherein said intermediate layer is formed of metal.

4. In a method according to claim 3 wherein said intermediate layer is made of aluminum.

5. In a method according to claim 1 wherein said intermediate layer is formed of a non-metallic material.

6. A method for manufacturing a semiconductor device, comprising the steps of:
    sequentially forming a first resist layer, an intermediate layer and a second resist layer on a substrate;
    exposing said first and second resist layers, forming an aperture by removing a portion of said second resist layer where a T-shaped gate is to be later formed;
    over-etching a portion of said intermediate layer which is opposed to said aperture thereby forming in said intermediate layer an aperture larger than the first-mentioned aperture; and
    forming in said first resist layer an aperture which is smaller than the aperture in said second resist layer and which is positioned inside thereof.

7. A method according to claim 6 forming a T-shaped gate in said apertures of said first and second resist layers, and lifting off from said substrate said first resist layer, said intermediate layer and said second resist layer so that said T-shaped gate remains on said substrate.

8. A method according to claim 6 wherein said intermediate layer is formed of metal.

9. A method according to claim 7 wherein said intermediate layer is formed of aluminum.

10. A method according to claim 6 wherein said intermediate layer is formed of a non-metallic material.

* * * * *